United States Patent [19]

Paul et al.

[11] 4,208,725
[45] Jun. 17, 1980

[54] MAGNETO-RESISTIVE DETECTOR FOR CROSS-TIE WALL MEMORY SYSTEM

[75] Inventors: Maynard C. Paul, Bloomington; David S. Lo, Burnsville, both of Minn.

[73] Assignee: Sperry Corporation, New York, N.Y.

[21] Appl. No.: 20,763

[22] Filed: Feb. 23, 1979

[51] Int. Cl.[2] .............................................. G11C 11/14
[52] U.S. Cl. ..................................... 365/87; 365/158; 365/172
[58] Field of Search ................... 365/12, 87, 158, 171, 365/172, 8

[56] References Cited

U.S. PATENT DOCUMENTS

| | | | |
|---|---|---|---|
| 3,868,660 | 2/1975 | Schwee | 365/171 |
| 4,080,591 | 3/1978 | Torok | 365/87 |

*Primary Examiner*—James W. Moffitt
*Attorney, Agent, or Firm*—Kenneth T. Grace; William E. Cleaver; Marshall M. Truex

[57] ABSTRACT

A method of and a detector for magneto-resistively reading out the information that is stored in a cross-tie wall memory system. The detector includes two current conductive elements that are positioned along and across the cross-tie wall in a magnetic film that is configured into a data track for sandwiching a plurality of memory cells therebetween. A separate current conductive element is centered over each of the sandwiched memory cells for conducting the read current drive signal out of the data track in the area of the Bloch-line, but forcing the read current drive signal through the data track in the area of the cross-tie. A stored binary 1, represented by a cross-tie, Bloch-line pair, is propagated into one end of the detector and is replicated in all of the sandwiched memory cells; conversely, a stored binary 0, represented by the absence of a cross-tie, Bloch-line pair, would be replicated in all of the sandwiched memory cells. The passage of a read current drive signal between the two conductive elements would, by a magneto-resistive readout, indicate the presence, or absence, of the cross-tie, Bloch-line pairs.

7 Claims, 20 Drawing Figures

| FUNCTION | GENERATOR | LINES |
|---|---|---|
| GENERATE | 48 | 14a, 14b |
| WIDE PUSH | 60 | 18 |
| WIDE NUCLEATE | 61 | 22 |
| NARROW ANNIHILATE | 62 | 18 |
| REPLICATE PUSH, NUCLEATE, REPEAT | 44 | 26a, 26b |
| | 32 | 28, 30 |
| DETECT | 41 | 42 |
| | | 43 |
| NARROW PUSH | 63 | 18 |
| NARROW NUCLEATE | 64 | 22 |
| WIDE (AND DETECTOR) ANNIHILATE | 65 | 18 |
| | | 22 |

RELATIVE DRIVE FIELD DIRECTIONS IN PLANE OF DATA TRACK 20

Fig. 5

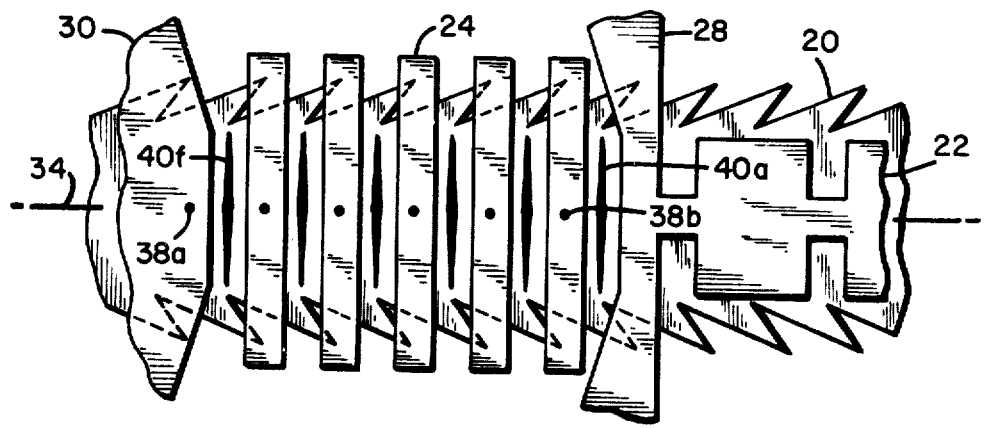
Fig. 6i
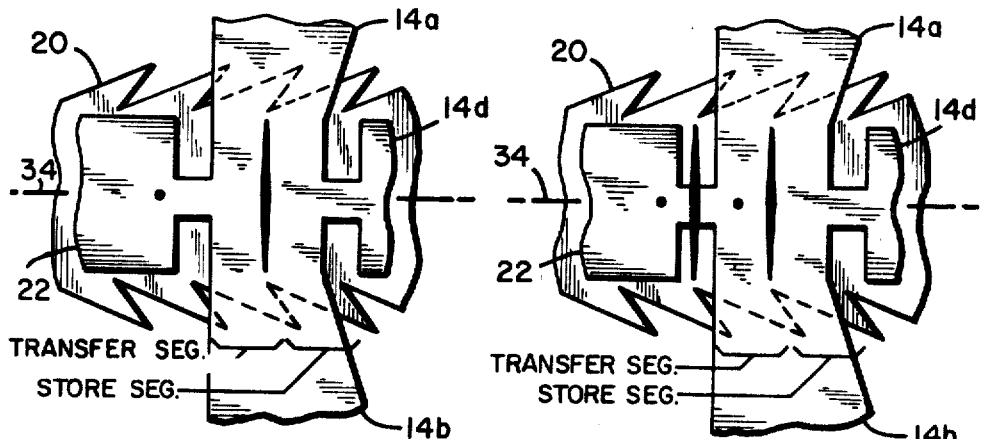
Fig. 6j
Fig. 6k
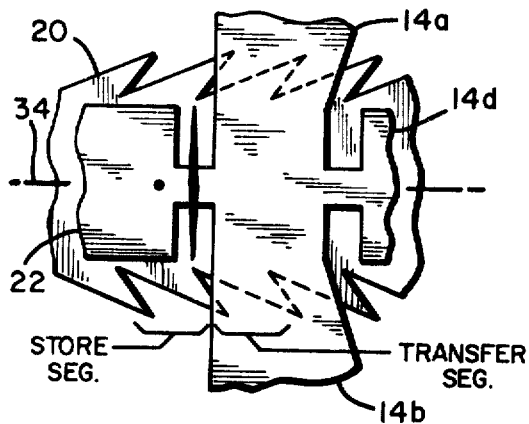
Fig. 6l

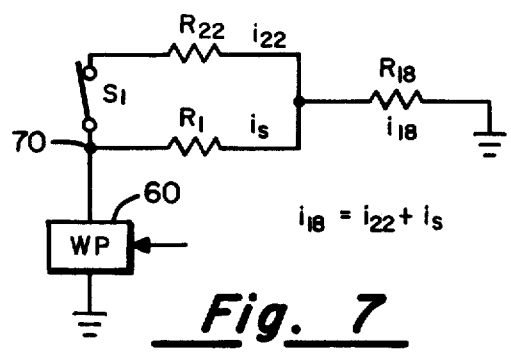
*Fig. 7*
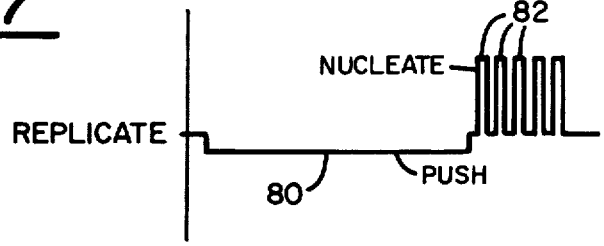
*Fig. 8*
| FUNCTION | GENERATOR | LINES | CURRENT SIGNAL |
|---|---|---|---|
| GENERATE | 48 | 12a, 12b | 100 ns, 15 ma |
| WIDE PUSH | 60 | 18<br>22 | 10 μs, 60 ma<br>10 μs, 19 ma |
| WIDE NUCLEATE | 61 | 18 | 50 ns, 105 ma |
| NARROW ANNIHILATE | 62 | 18<br>22 | 25 μs, 62 ma<br>25 μs, 46 ma |
| REPLICATE PUSH NUCLEATE | 44 | 26a, 26b | 10 μs, 10 ma<br>50 ns, 50 ma |
| DETECT | 36 | 36a, 36b | 5 μs, 5 ma |
| NARROW PUSH | 63 | 18<br>22 | 15 μs, 26 ma<br>15 μs, 13 ma |
| NARROW NUCLEATE | 64 | 18 | 50 ns, 105 ma |
| WIDE (AND DETECTOR) ANNIHILATE | 65 | 18<br>22 | 25 μs, 110 ma<br>25 μs, 21 ma |
*Fig. 9*

MAGNETO-RESISTIVE DETECTOR FOR CROSS-TIE WALL MEMORY SYSTEM

The invention described herein was made in the course of, or under, a contract with the Department of the Navy.

BACKGROUND OF THE INVENTION

The propagation of inverted Néel wall sections in a serial accessed memory system was proposed by L. J. Schwee in the publication "Proposal On Cross-tie Wall and Bloch-line Propagation In Thin Magnetic Films," IEEE Transactions on Magnetics, MAG 8, No. 3, pages 405-407, September, 1972. Such a memory system utilizes a ferromagnetic film strip of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie walls is a section of inverted Néel wall that is bounded by a cross-tie on one end and a Bloch-line on the other end.

In such a cross-tie wall memory system, information is entered at one end of the serial access memory system by the generation of an inverted Néel wall section, formed by a cross-tie on one side and a Bloch-line on the other, that is representative of a stored binary 1 or of a non-inverted Néel wall section (i.e., the absence of a cross-tie, Bloch-line pair) that is representative of a stored binary 0. Such information is moved or propagated along the cross-tie wall by the successive generation (and then the selective annihilation) of inverted Néel wall sections at successive memory cells along the cross-tie wall. In the D. S. Lo, et al, Pat. No. 3,906,466 there is disclosed a propagation circuit for the transfer of inverted Néel wall sections through successive memory cells along the cross-tie walls. In the L. J. Schwee U.S. Pat. No. 3,868,660; in a Naval Ordinance Laboratory Report NOLTR 73-185; in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624-625, and in the publication "Cross-Tie/Bloch-Line Detection," G. J. Cosimini, et al, AIP Conference Proceedings, No. 3, 23rd Annual Conference on Magnetism and Magnetic Materials, 1978, published March, 1978, pages 1828-1830, there have been published some recent results of the further development of cross-tie wall memory systems and of detectors for the readout of binary information that is stored therein.

In a cross-tie wall memory system, the selective generation and propagation of the digital data representing inverted Néel wall sections about associated cross-ties and Bloch-lines have been demonstrated in the laboratory. Additionally, it has been shown that the data track of a cross-tie wall memory system may be configured into a film strip having repetitive patterns of asymmetrically serrated edge contours. Such film strip configurations are disclosed in the L. H. Johnson, et al, U.S. Pat. No. 4,075,612 and the L. J. Schwee U.S. Pat. No. 3,868,660, and in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624-625. More recently it has been proposed to construct cross-tie wall memory systems from a plurality of data tracks, each of which is formed as a strip of isotropic magnetic film, i.e., a film having substantially zero uniaxial anisotropy. The data-track-defining strip of isotropic magnetic film utilizes its shape, i.e., its edge contour, induced anisotropy, rather than its easy axis magnetic field induced anisotropy, to constrain the cross-tie wall within the planar contour of the film strip. The use of the shape induced anisotropy of an isotropic strip of magnetic film permits the use of nonlinear, i.e., curved, data tracks which may be configured into cross-tie wall memory systems that perform both memory and logic functions. Such a system is disclosed in the E. J. Torok U.S. Pat. No. 4,075,613.

Although the generation, propagation and logic manipulation of inverted-Néel-wall-section-defining data bits and the detection or readout thereof have received considerable study, one area that can still use improvement in the development of a workable cross-tie wall memory system is the detector or the device that reads out the information that is stored in the cross-tie wall memory system. Many such detectors or readout devices have been found to be workable and are disclosed in the patent literature—see the D. S. Lo, et al, U.S. Pat. No. 4,001,795; E. J. Torok, et al, U.S. Pat. No. 4,024,515; E. J. Torok U.S. Pat. No. 4,024,516; and the E. J. Torok, et al U.S. Pat. No. 4,034,359. The present invention is directed toward an improved method of and an apparatus for reading out the information that is stored in a cross-tie wall memory system.

SUMMARY OF THE INVENTION

In the present invention, the two opposing current conductive elements of the magneto-resistive detector are spaced apart a sufficient distance to sandwich a plurality of memory cells therebetween. This increased distance provides a like increase in the length of the ferromagnetic data track that is to be affected by the detector read current signal which passes between the opposing electrodes via the data track. The stored binary information that is to be read out by the detector is initially shifted along the data track and into a position near a first one of the detector's opposing electrodes: if it is a binary 1, represented by a cross-tie, Bloch-line pair, the cross-tie, Bloch-line pair is replicated in each of the sandwiched memory cells; if it is a binary 0 represented by the absence of a cross-tie, Bloch-line pair, no cross-tie, Bloch-line pairs are replicated or provided in the sandwiched memory cells. The presence or absence of the replicated cross-tie, Bloch-line pairs, upon being affected by the detector read current signal, provides an output signal that has a substantially improved signal-to-noise ratio over that provided by the detection vel non of a single cross-tie, Bloch-line pair. Additionally provided are a plurality of current conductive members, one being centered in each of the sandwiched memory cells for providing a low resistance current path out of the data track in the area of the data track occupied by the Bloch-lines but not by the cross-ties of the cross-tie, Bloch-line pairs.

BRIEF DESCRIPTION OF THE DRAWINGS

FIG. 5 is an illustration of an illustrative timing diagram for the operation of the cross-tie wall memory system of FIG. 1.

FIGS. 6a through 6l are schematic illustrations illustrating the generate/propagate/detect operations of a cross-tie, Bloch-line pair in the system of FIG. 1 as effected by the signals of the timing diagram of FIG. 5.

FIG. 7 is a diagrammatic circuit schematic for the Push-Annihilate current sgnals of FIG. 5.

FIG. 8 is an illustration of an alternative Replicate drive signal to that of FIG. 5

FIG. 9 is a table of illustrative current signal durations and magnitudes for the timing diagram of FIG. 5.

DESCRIPTION OF THE PREFERRED EMBODIMENT

Figure 1:
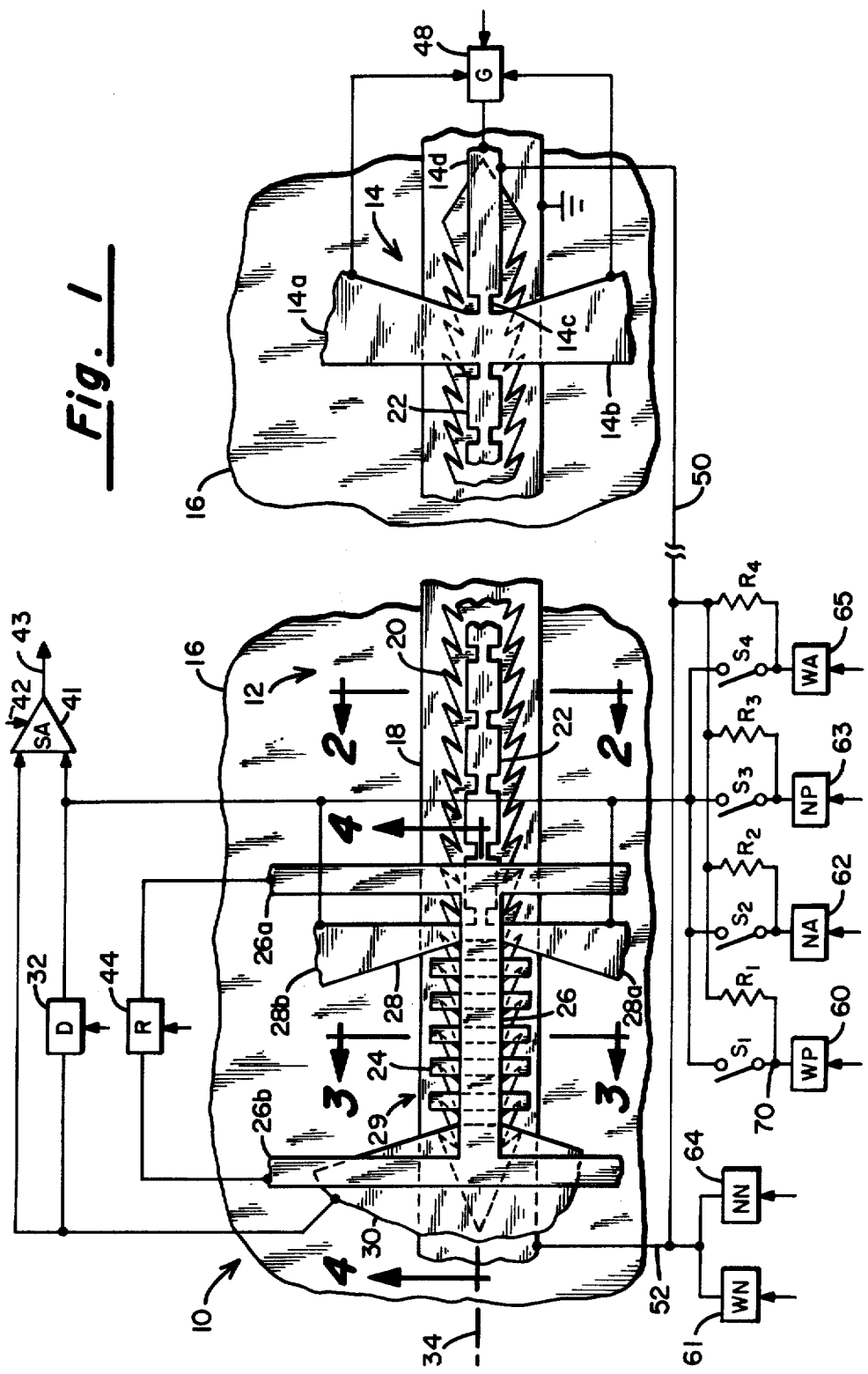
FIG. 1 is a schematic illustration of a portion of a cross-tie wall memory system illustrating, in detail, the detector of the present invention.

FIG. 1 is an illustration of a portion of a cross-tie wall memory system into which the detector 10 of the present invention has been incorporated.

Figure 2:
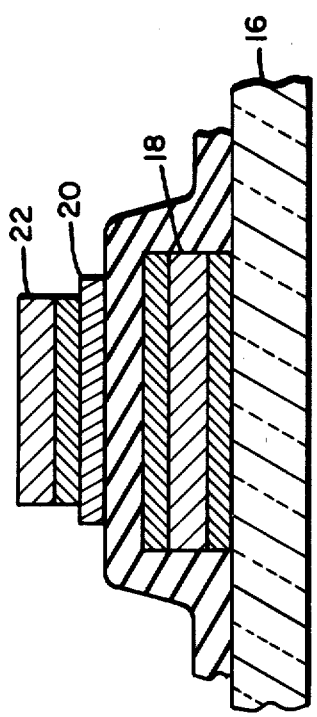
FIG. 2 is an illustration of a cross-section of the memory plane of FIG. 1 taken along line 2—2 thereof illustrating the stacked, superposed elements of FIG. 1 in the area of the propagating data track.

FIG. 2 is an illustration of a cross-section of the memory plane of FIG. 1 taken along line 2—2 thereof for the purpose of illustrating the stacked, superposed elements in the area of the propagating shift register 12 of FIG. 1. The memory system of FIG. 1 includes a non-magnetizable, e.g., glass, substrate member 16 having the following active members arranged in a stacked, superposed integral assembly: conductive, e.g., gold, stripline 18; magnetizable, e.g., NiFe, data track 20; and conductive, e.g., gold, stripline 22. Not illustrated in FIG. 1, but illustrated in FIG. 2, are: a thin, adhesive layer of, e.g., chromium, that may be affixed to the top and/or the bottom surfaces of the metallic layers for ensuring an integral assembly of the metallic layers with the adjacent metallic or insulating layers; and, a thin, smoothing and insulating layer of, e.g., SiO, between the current-conducting striplines 18 and 22. Still further, but not illustrated in either FIGS. 1 or 2, superposed this entire assembly and affixed to the top surface thereof, there may be provided an additional, e.g., SiO sealing and insulating layer.

Figure 3:
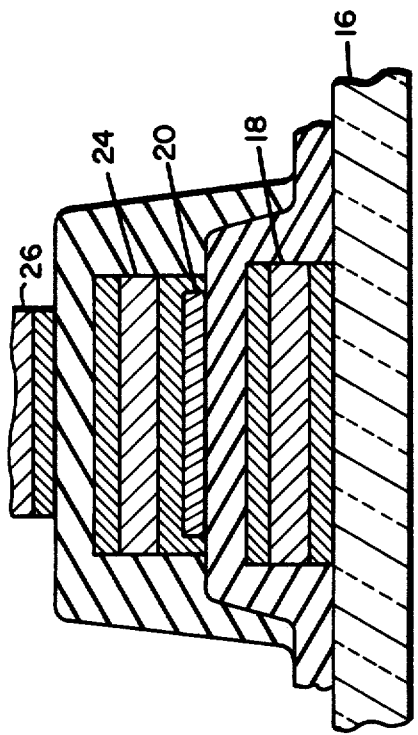
FIG. 3 is an illustration of a cross-section of the memory plane of FIG. 1 taken along line 3—3 thereof illustrating the stacked, superposed elements of FIG. 1 in the area of the detector of the present invention.

FIG. 3 is an illustration of a cross-section of the memory plane of FIG. 1 taken along line 3—3 thereof for the purpose of illustrating the stacked, superposed elements of the detector of the present invention of FIG. 1. In the area of the detector 10, the memory system of FIG. 1 includes a non-magnetizable, e.g., glass, substrate member 16 having the following active members arranged in a stacked, superposed integral assembly: conductive, e.g., gold, stripline 18; magnetizable, e.g., NiFe, data track 20; conductive, e.g., gold, stripline 24; and, conductive, e.g., gold, stripline 26. Not illustrated in FIG. 1 but illustrated in FIG. 3, are: a thin, adhesive layer of, e.g., chromium, that may be affixed to the top and/or the bottom surfaces of the metallic layers for ensuring an integral assembly of the metallic layers with the adjacent metallic or insulating layers; and, a thin, smoothing and insulating layer of, e.g., SiO, between the current-conducting striplines 18, 24 and 26. Note that the current-conducting stripline 24 is one of a plurality, e.g., five, that are centered over each of the sandwiched memory cells between the two current-conducting elements 28, 30 of detector 10, that are in intimate and electrically-conducting contact with the NiFe data track 20, and that are centered in the memory cells sandwiched between the two electrodes 28 and 30. the striplines 24 are incorporated in detector 10 for conducting the read current drive signal, provided by read current drive signal generator 32, out of data track 20, in the area of the Bloch-lines, but for forcing the read current drive signal through the data track 20 in the area of the cross-ties. Still further, but not illustrated in either FIGS. 1 or 3, superposed this entire assembly and affixed to the top surfaces thereof, there may be provided an additional SiO sealing and insulating layer.

With respect to substrate 16 and stripline 18, such configurations may be similar to that of the D. S. Lo, et al, U.S. Pat. No. 3,906,466. Additionally, with respect to data track 20, it may be configured in the manner as taught by the L. J. Schwee U.S. Pat. No. 3,868,660 and in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624–625; or in the manner as taught by the L. H. Johnson, et al, U.S. Pat. No. 4,075,612. With respect to the particular configuration or embodiment of data track 20, it is preferably configured into a thin strip whose two opposing edges are formed into mirror-imaged, repetitive patterns of successive narrow portions, transverse to centerline 34, that form wide portions therebetween by which the cross-tie, Bloch-line pairs are structured along the cross-tie wall.

As is well known, such data track, when affected by the proper drive fields, establishes a cross-tie wall along its geometric centerline, which is substantially aligned along its longitudinal axis, identified as line 34 of FIG. 1. Preferably the film strip from which data track 20 is fabricated is isotropic, i.e., has substantially zero magnetic field induced anisotropy, and utilizes its shape, i.e., its edge contour, to constrain the cross-tie wall within its planar contour and along its longitudinal axis 34. However, it is to be noted that data track 20 may be configured into a film strip whose two opposing edges are parallel, straight lines along which the positioning of the Bloch-line is structured solely by the configuration of a drive line such as taught in the E. J. Torok U.S. Pat. No. 4,075,613.

However, in the present illustrated embodiment of FIG. 1, stripline 22 is configured into a wide-narrow drive line comprised of a plurality of rectangularly-shaped wide portions that are serially coupled by narrow portions therebetween, in which the wide portion is approximately three times the length of the narrow portion. The narrow portion of stripline 22 is substantially centered about the alternate, i.e., every other, narrow portion of data track 20, while the wide portion of stripline 22 is substantially centered about the other alternate narrow portion of data track 20. For purposes of the present invention, the narrow portions of data track 20 and the associated narrow portions of stripline 22 are defined as a store segment, while the narrow portions of data track 20 and the associated wide portions of stripline 22 are defined as a transfer segment— see the D. S. Lo, et al, U.S. Pat. No. 3,906,466—both combining to comprise a memory cell, a plurality of which are aligned along shift register 12 including data track 20, stripline 18 and stripline 22 of FIG. 1. Thus, generator 14 of FIG. 1 is centered about a store segment while detector 10 is centered about a transfer segment.

However, in the area of detector 10, each successive serrated portion of data track 20 is defined as a memory cell (this is in contrast to shift register 12, wherein each successive pair of serrated portions of data track 20 is defined as a store segment and a transfer segment for forming a memory cell), there being no store segment, transfer segment required due to the unique method of propagation of a cross-tie, Bloch-line pair through detector 10. When a cross-tie, Bloch-line pair has been propagated from generator 14, through shift register 12, and the associated cross-tie is resident in the narrow portion 28c of wide-narrow stripline 22 immediately upstream of conductive element 28, a series of bi-polar push-nucleate current drive signals from generator 44 replicates the cross-tie, Bloch-line pair in each successive serrated portion of data track 29 between conductive elements 26a, 26b. This will be further explained in the discussion of the operation of FIG. 1 as illustrated in FIGS. 6a through 6l and the timing diagram of FIG. 5.

With particular reference to FIG. 2, there is presented a cross-sectional view of the superposed stripline 18, data track 20, stripline 22 of FIG. 1 taken along line 2—2 thereof for the purpose of illustrating the configuration of the stacked, superposed elements thereof. FIG. 2 illustrates that this stacked, superposed relationship includes the following listed successive layers:

glass substrate 16—0.50 mm thick
chromium adhesive layer—100 Å thick
gold stripline 18—1500 Å thick
chromium adhasive layer—100 Å thick
SiO insulative layer—12,500 Å thick
Permalloy data track 20—approximately 81% Ni-19% Fe, 350 Å thick
chromium adhesive layer—100 Å thick.
gold stripline 22—1000 Å thick.

Figure 4:
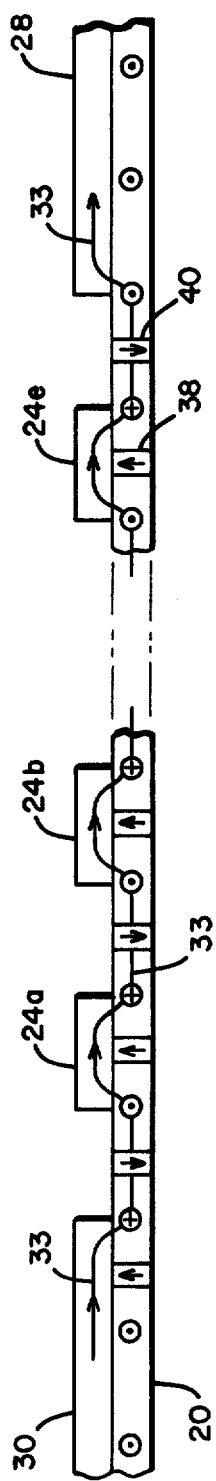
FIG. 4 is an illustration of a cross-section of the detector of the present invention taken along line 4—4 of FIG. 1.

With particular reference to FIG. 3, there is presented a cross-sectional view of the superposed stripline 18, data track 20, conductive element 24, and stripline 26 of FIG. 1 taken along line 3—3 thereof for the purpose of illustrating the configuration of the stacked, superposed elements in the area of detector 10 of FIG. 1. FIG. 3 illustrates that this stacked, superposed relationship includes the following listed successive layers:

glass substrate 16—0.50 mm thick
chromium adhesive layer—100 Å thick
gold stripline 18—1500 Å thick
chromium adhesive layer—100 Å thick
SiO insulative layer—12,500 Å thick
Permalloy data track 20—approximately 81% Ni-19% Fe, 350 Å thick
chromium adhesive layer—100 Å thick
gold stripline 24—1000 Å thick
chromium adhesive layer—100 Å thick
SiO insulative layer—12,500 Å thick
chromium adhesive layer—100 Å thick
gold stripline 26—1500 Å thick With particular reference to FIG. 4, there is presented a cross-sectional view of detector 10 of the present invention taken along line 4—4 of FIG. 1. This cross-sectional view of detector 10 of FIG. 1 is presented for the exclusive purpose of illustrating the manner in which the read current drive signal 33 that is coupled across conductive elements 28, 30 flows therebetween. Accordingly, only the elements of the cross-tie wall memory system of FIG. 1 that are affected by this flow of read current drive signal 33 and illustrated in FIG. 4 for the purpose of simplifying the illustration of the operation thereof.

In FIG. 4 there is illustrated the serrated-edged data track 20 upon which are integrally and electrically conductively formed the conductive elements 28, 30 and the conductive elements 24a, 24b, 24c, 24d, 24e spaced therebetween. As discussed hereinabove, detector 10 includes two conductive elements 28, 30 that are positioned along the cross-tie wall in the serrated-edged data track 20 wherein a plurality of memory cells are sandwiched therebetween. A separate current conductor 24 is centered over each of the sandwiched memory cells for conducting the read current drive signal 33 out of the data track 20 in the area of the Bloch-line 38, but forcing the read current drive signal 33 back through the data track 20 in the area of the cross-tie 40.

In this configuration, the read current drive signal 33 is forced to flow across each cross-tie 40 in data track 20 in the area of detector 10 but because of the conductive elements 24 is caused to flow out of the data track 20 into conductive element 24 in the area of each of the Bloch-lines 38 in detector 10. Thus, detector 10 during the readout operation has a bit multiplying effect upon the output signal generated by sense amplifier 41 as provided on output line 43 when properly gated by a gating signal on line 42. This bit amplifying effect of the manner in which the read current drive signal 33 flows through the alternate portions of data track 20 and the conductive elements 30, 24 and 28, provides an amplified output signal having a significantly improved signal-to-noise ratio over that previously obtainable when detecting the magneto-resistive readout effect of a single cross-tie. Additionally illustrated is the manner in which the magnetization M is oriented along the cross-tie wall in data track 20 as represented by the circles enclosing a dot or a cross indicating the direction of magnetization being directed out of or into, respectively, the plane of the drawing while the magnetization M within the cross-tie, Bloch-line pair are represented by the downwardly directed, upwardly directed, respectively, arrows indicated within cross-tie 40 and Bloch-line 38, respectively.

With reference back to FIG. 1, there is illustrated a shift register 12 comprised of straight-edged stripline 18, serrated-edged data track 20 and wide-narrow-edged stripline 22. Shift register 12 is terminated at one end by generator 14, comprised of stripline 18, data track 20 and a terminating portion of stripline 22 having conductive elements 14a, 14b extending from a wide portion thereof followed by a narrow portion 14c, in which the cross-tie of the cross-tie, Bloch-line pair is created, and a wide end portion 14d. Shift register 12 is terminated on the other end by detector 10, consisting of stripline 18, data track 20, and a terminating portion 28 of stripline 22 having conductive elements 28a, 28b extending from a wide portion thereof. Following element 28 and separated therefrom is a conductive element 30 of detector 10, across which separation or gap 29 the presence or absence of the multiple cross-tie is detected.

In this illustrated embodiment, stripline 22, and its integral elements 14a, 14b, 14c, 14d, and 28a, 28b, and conductive element 30 are formed during the same, e.g., vacuum deposition, step of the same material and of the same thickness. This method of forming the generator elements, the propagate wide-narrow drive line elements, and the detector elements in one layer during the same process step greatly simplifies the fabrication of a complete cross-tie wall memory system. Additionally, the memory plane of the cross-tie wall memory system of FIG. 1 is symmetrical about its longitudinal axis or centerline 34 whereby current paths are symmetrical providing symmetry of the so-generated drive fields.

With particular reference to FIG. 5 and FIGS. 6a through 6l, there are presented illustrations of the timing diagram and the resultant generation, propagation and detection of cross-tie, Bloch-line pairs in the cross-tie wall memory system of FIG. 1.

The propagation of the cross-tie, Bloch-line pairs along data track 20 under the influence of the drive fields provided by the coupling of the proper current drive signals to stripline 18 and stripline 22 will now be described. This requires a store-transfer sequence of the propagation of the cross-tie and the Bloch-line within the memory cell—see the D. S. Lo, et al, U.S. Pat. No. 3,906,466. In this method of propagation, the cross-tie wall is initially formed along the geometric centerline of the data track by an in-plane field that is directed normal to the longitudinal axis of the data track. The serrated edges of the data track, when the in-plane field is removed, cause the magnetization M within the data track to collapse forming two anti-parallel magnetic domains on opposite sides of the cross-tie wall.

The combination of the pattern of the serrated edges of the data track and the design of the propagate drive line, the wide-narrow edge pattern of stripline 22, establishes memory cells along the data track. To propagate the cross-tie, Bloch-line pairs in the well-known manner, each memory cell is required to include a store segment and a transfer segment, the order and names of which are purely arbitrary. These two segments are required due to the mechanism whereby cross-tie, Bloch-line pairs are propagated through a data track.

Initially, a cross-tie, Bloch-line pair is established in a first store segment defined by the length of one serrated edge along the data track in which the cross-tie is oriented between the narrow width or portion of the data track and the associated Bloch-line is oriented between the two adjacent narrow portions and on the downstream side of the associated cross-tie. Next, a drive filed separates the Bloch-line from the associated cross-tie, "pushing" the Bloch-line downstream into the next adjacent transfer segment leaving the associated cross-tie in its initial position. Next, a nucleate drive field generates a cross-tie, Bloch-line pair between the separated cross-tie and Bloch-line. Next, an annihilate drive field annihilates the cross-tie, Bloch-line pair that is resident in the store segment effectively transferring the initial cross-tie, Bloch-line pair from the store segment into the downstream transfer segment. This sequence is repeated so that after two consecutive push-nucleate-annihilate cycles the cross-tie, Bloch-line pair has been propagated from a store segment, through a transfer segment of the same memory cell and into the store segment of the next adajcent downstream memory cell.

Thus, in the illustrated embodiment, the center of the narrow portion of wide-narrow-edged stripline 22 and the corresponding narrow portion of serrated-edged data track 20 define a store segment while the downstream center of the wide portion of wide-narrow-edged stripline 22 and the corresponding narrow portion of serrated-edged data track 20 define the transfer segment. Thus, each consecutive downstream narrow-wide segment of stripline 22 defines a memory cell comprised of a store segment and a downstream transfer segment.

Figure 6A:
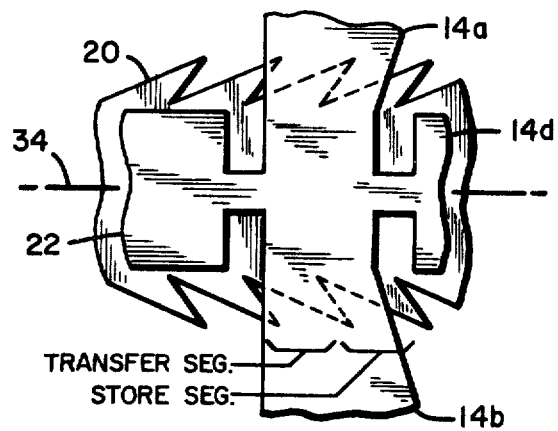
Figures 6B, 6C:
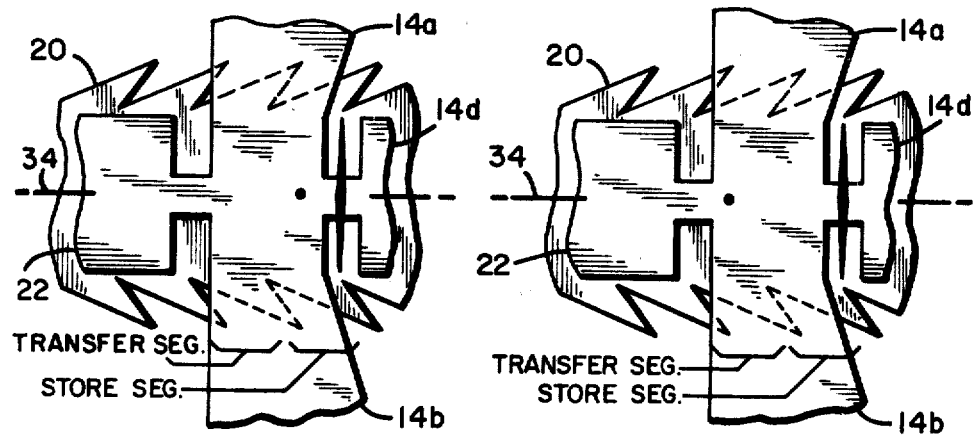

With respect to the timing diagrams of FIG. 5, assume that prior to a time $t_0$ the generator 14 of FIG. 1 is empty having no cross-tie, Bloch-line pair established therein. This is as indicated in FIG. 6a. Now, at a time $t_0$, generator 48 couples a Generate current signal to generator 14, via conductive elements 14a, 14b, generating a cross-tie, Bloch-line pair in generator 14. This is as illustrated in FIG. 6b. Note that generator 48 selectively couples the Generate current signal to generator 14 for the generation vel non of a cross-tie, Bloch-line pair within generator 14. In the timing diagram of FIG. 5 the generation of the cross-tie, Bloch-line pair is indicative of the significant amplitude signal representative of the storage of a "1" in the cross-tie wall memory system of FIG. 1 while the significant signal is indicative of the storage of a "0" in the cross-tie wall memory system of FIG. 1.

Next, at time $t_1$ with the Generate current signal terminated, generator 60, via closed normally-open switch $S_1$, couples a positive polarity Wide Push current signal to stripline 22 via conductive element 28a, 28b. Wide Push current signal flows down strip-line 22 from left to right, through lines 50, 52, through stripline 18 from left to right and thence to ground. This Wide Push current signal "pushes" the Bloch-line in the store segment of the memory cell in generator 14 into the next adjacent downstream transfer segment thereof—this is as illustrated in FIG. 6c.

With particular reference to FIG. 7, there is presented a diagrammatic circuit schematic of the equivalent circuit for the push-annihilate current generators 60, 62, 63, 65 of FIG. 1. When Wide Push current generator 60 couples the Wide Push current signal to the common point or node 70, with normally-open switch $S_1$ closed, the Wide Push current signal is coupled to the parallel combination of the resistance $R_{22}$ of stripline 22 and the shunt resistance of resistor $R_1$ and the serially coupled resistance $R_{18}$ of stripline 18. The shunt resistor $R_S$ is, for the four operations of FIG. 4: Wide Push at time $t_1$; Narrow Annihilate at time $t_3$; Narrow Push at time $t_{10}$; and Wide Annihilate at time $t_{12}$, selected to be of the desired magnitude to provide the desired relative current magnitude of $i_{22}$ and $i_{18}$ to flow down striplines 22 and 18, respectively. When such operations are discussed herein, the shunting effect of shunt resistors $R_1$, $R_2$, $R_3$ and $R_4$ shall not be discussed in detail, it being understood that the magnitude of the, e.g., Wide Push current signal in striplines 18 and 22 are not necessarily the same because of the use of the shunt resistors. Additionally, it is to be understood that because striplines 18 and 22 are on opposite sides of data track 20, current signals of the same polarity flowing in the same direction generate drive fields in the plane of data track 20 that are of the opposite polarity. Lastly, the current signals shall be discussed as flowing from, e.g., left to right along stripline 22 even though the polarities of the different signals, e.g., Wide Push current signal from generator 60 and Narrow Annihilate current signal from generator 62, may be opposite.

Figures 6D, 6E:
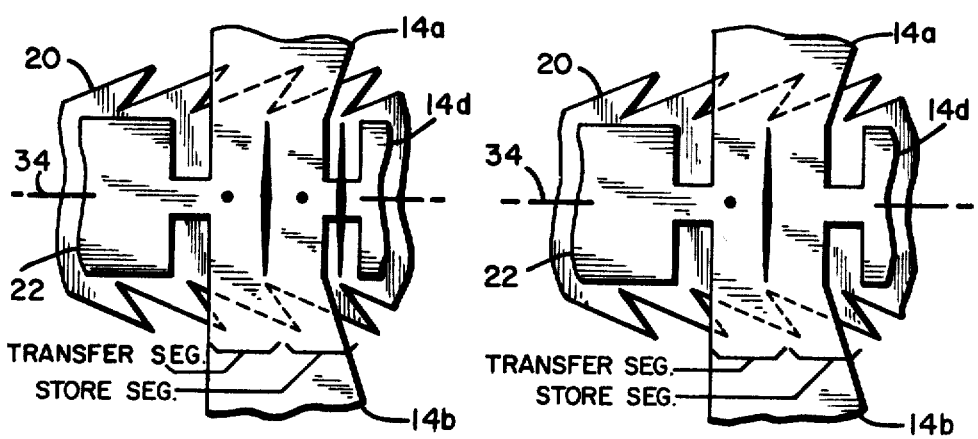

Next, at time $t_2$, with the Wide Push current signal terminated, generator 61, via line 52, couples a negative polarity Wide Nucleate current signal to stripline 18. Wide Nucleate current signal flows down stripline 18 left to right to ground. This Wide Nucleate current signal generates a new cross-tie, Bloch-line pair between the separated cross-tie, Bloch-line pair previously separated at time $t_1$—this is as illustrated in FIG. 6d.

Next, at time $t_3$, with the Wide Nucleate current signal terminated, generator 62, via closed normally-open switch $S_2$, couples a positive polarity Narrow Annihilate current signal to stripline 22 via conductive element 28a, 28b. Narrow Annihilate current signal flows down stripline 22 from left to right, through lines 50, 52, through stripline 18 from left to right, and thence to ground. This Narrow Annihilate current signal annihilates the cross-tie, Bloch-line pair resident in the store segment of the memory cell in generator 14—this is as illustrated in FIG. 6e. The cross-tie, Bloch-line pair generated in generator 14 in the store segment of the memory cell in generator 14 has now been propagated downstream into the associated transfer segment. Note that at this time a cross-tie, Bloch-line pair if previously, as at time $t_0$, were in the store segment 28c immediately upstream of detector 10, it would now be in the transfer segment 28d of detector 10 as illustrated in FIG. 6l.

Next, at time $t_4$, with the Narrow Annihilate current signal terminated, replicate generator 44 couples a Replicate current drive signal to electrically conductive elements 26a, 26b. Replicate current drive signal is comprised of a bipolar signal, a first polarity Push signal and a second and opposite polarity Nucleate signal. Assuming that at time $t_4$ a cross-tie 40a, Bloch-line 38a pair would be in the transfer segment 28d of the memory cell in detector 10—see FIG. 6f—the Replicate Push current signal will push the associated Bloch-line 38a into the next adjacent downstream memory cell—this is as illustrated in FIG. 6g. Note that as discussed hereinabove, within detector 10 every consecutive serrated-edged section of data track 20 functions as a memory cell. The Replicate Nucleate current signal then nucleates or generates a cross-tie 40b, Bloch-line 38b pair between the separated cross-tie 40a and Bloch-line 38a initially in the transfer segment 28d of the memory cell in detector 10 at time $t_4$—this is as illustrated in FIG. 6h. The next Replicate current drive signals at times $t_5$, $t_6$, $t_7$ and $t_8$ replicate cross-tie, Bloch-line pairs filling up the consecutive memory cells in detector 10. This is as illustrated in FIG. 6i.

As an alternate to the replicate drive field waveform of FIG. 5, replicate generator 44 may couple an initial long duration, e.g., positive polarity Push current signal 80—see FIG. 8—to conductive elements 26a, 26b followed by five successive short duration, e.g., negative polarity Nucleate current signals 82. In this sequence, the Bloch-line downstream of the downstream edge of conductive element 28 would be pushed to a position downstream of the upstream edge of conductive element 30 after which the cross-tie, Bloch-line pairs would be generated or nucleated in the successive memory cells therebetween.

Next, at time $t_9$, with the Replicate current drive signals terminated, detector generator 32 couples a Read current signal across conductive elements 28 and 30 of detector 10. The resulting readout signal on line 43, as detected by sense amplifier 41 and as gated by the Gate Detect signal on line 42, is a function of the magneto-resistive effect of the presence or absence of the cross-ties between the electrically conductive elements 24 in detector 10. As under the present assumed conditions, a plurality of cross-ties are present in detector 10 between conductive elements 28 and 30, sense amplifier 41 detects a relatively high magneto-resistive current-/voltage condition providing a relatively significant "1" output signal on line 43.

Next, at time $t_{10}$, with the Read current drive signal from generator 32 terminated, generator 63, via closed normally-open switch $S_3$, couples a negative polarity Narrow Push current signal to strip-line 22 via conductive element 28a, 28b. Narrow Push current drive signal flows down stripline 22 from left to right, through lines 50, 52, through strip-line 18 from left to right and thence to ground. This Narrow Push current signal "pushes" the Bloch-line in the transfer segment of the memory cell in generator 14 into the store segment of the next downstream memory cell—this is as illustrated in FIG. 6j.

Next, at time $t_{11}$, with the Narrow Push current signal terminated, generator 64, via line 52, couples a negative polarity Narrow Nucleate current signal to strip-line 18. Narrow Nucleate current signal flows down stripline 18 left to right to ground. This Narrow Nucleate current signal generates a new cross-tie, Bloch-line pair between the separated cross-tie, Bloch-line pair previously separated at time $t_{10}$—this is as illustrated in FIG. 6k.

Next, at time $t_{12}$, with the Narrow Nucleate current signal terminated, generator 65, via closed normally-open switch $S_4$, couples a negative polarity Wide Annihilate current signal to stripline 22 via conductive element 28a, 28b. Wide Annihilate current signal flows down stripline 22 from left to right, through lines 50, 52, through stripline 18 from left to right and thence to ground. This Wide Annihilate current signal annihilates the cross-tie, Bloch-line pair presently resident in the transfer segment of the memory cell in generator 14 leaving the now-propagated cross-tie, Bloch-line pair resident in the store segment of the next downstream memory cell from generator 14—this is as illustrated in FIG. 6l. The Wide Annihilate current signal also annihilates all the cross-tie, Bloch-line data bits (if any) in the detector 10, thus allowing the next Bloch-line push into the transfer segment of the memory cell in detector 10 in order to receive the next data bit, if any.

Figure 6F:
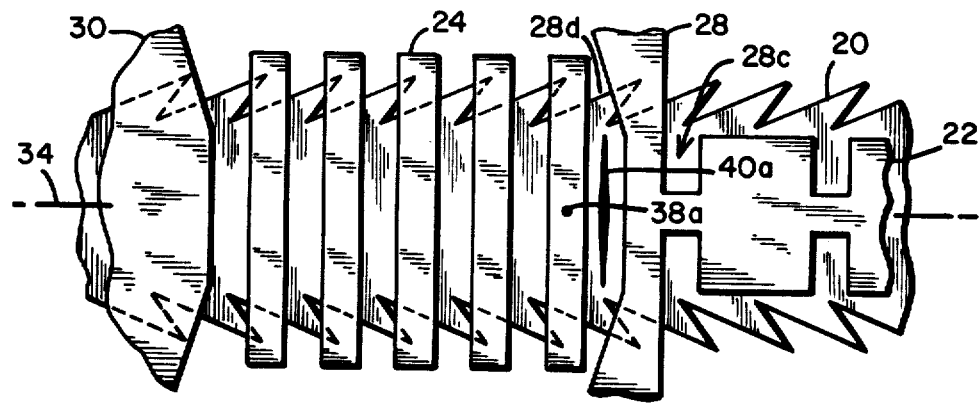
Figure 6G:
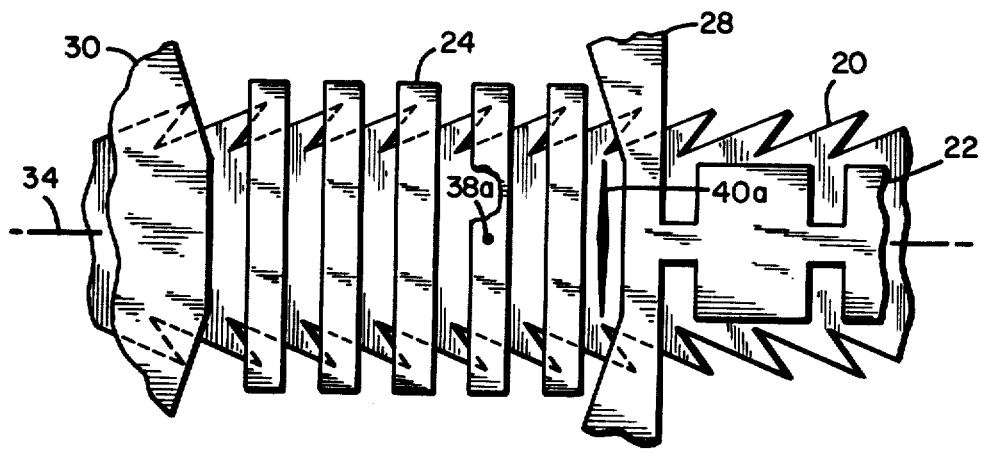
Figure 6H:
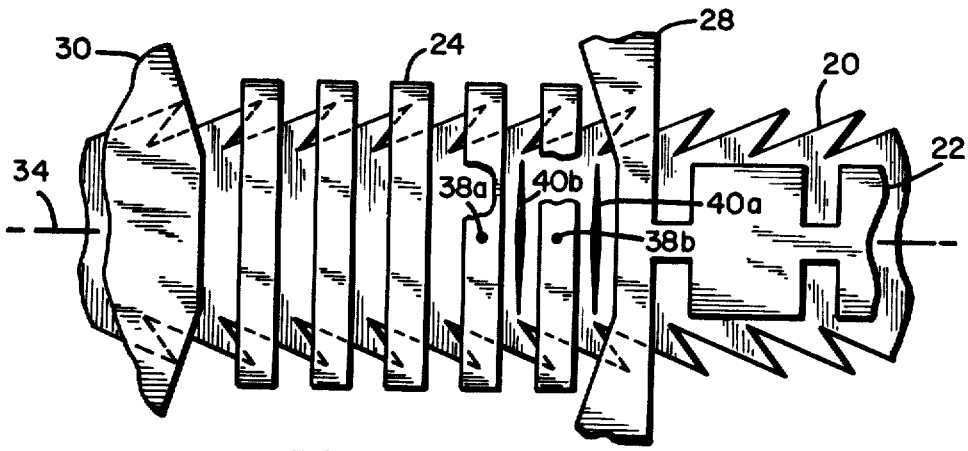

This push/nucleate/annihilate sequence continues propagating the cross-tie, Bloch-line pairs generated by generator 14 through the shift register 12 and into the detector 10—see FIG. 6f—from whence the information is read out in the manner as described above with particular reference to FIG. 5 at time $t_9$. As an alternative method to that described hereinabove with particular reference to the Replicate current drive signal generated by generator 44 and coupled to line 26 for the replication vel non of the cross-tie, Bloch-line pair within vel non detector 10, generator 44 may couple a Replicate current drive signal to line 26 having the waveform illustrated in FIG. 7. In this method, the Push current signal 80 is of a substantial duration and appropriate intensity to push the cross-tie originally resident in the transfer segment of the memory cell in detector 10—such as illustrated in FIG. 6f—into the last or fifth memory cell of detector 10 immediately to the right of conductive element 30. This generates an inverted Néel wall section substantially between the opposing surfaces of conductive electrodes 28 and 30 whereby a series of Nucleate current signals 82 causes the cross-tie, Bloch-line pairs to be replicated into the various downstream memory cells within detector 10 to achieve the same magnetic state as that illustrated in FIG. 6i as discussed hereinabove.

FIG. 9 is a table of illustrative current signal durations and magnitudes for the timing diagram of FIG. 5 using Bitter powder technique for observation.

What is claimed is:

1. A detector for a cross-tie wall memory system comprising:

magnetic data track means whose two opposing edges are formed into repetitive patterns of successive narrow portions that form wide portions therebetween;

first and second electrically conductive detector elements spaced apart and along said data track means and electrically conductively affixed thereto for sandwiching a plurality of successive wide and narrow portions of said data track means therebetween;

a plurality of separate electrically conductive detector elements electrically conductively affixed to said data track means, each substantially centered within the successive wide portions of said data track means that are sandwiched between said first and second detector elements;

replicator means including an electrically conductive replicator stripline means aligned along said data track means for coupling a plurality of bipolar replicate drive fields to that portion of said data track means that is sandwiched between said first and second detector elements for replicating a cross-tie, if resident at said first detector electrode, in each of the sandwiched successive narrow portions of said data track means; and, detector readout means coupling a read current drive signal across said first and second detector elements for generating a readout signal indicative of the presence or absence of said replicated cross-ties in said sandwiched successive narrow portions of said data track means.

2. The detector of claim 1 wherein said plurality of separate electrically conductive detector elements and said first and second detector elements are spaced apart along said data track means for forcing said read current drive signal to flow through said data track means in the areas of said sandwiched successive narrow portions of said data track means but to flow through said plurality of separate electrically conductive detector elements in the areas of said sandwiched wide portions of said data track means.

3. A detector for a cross-tie wall memory system, comprising:

magnetic repetitive edge-patterned data track means for forming successive wide-narrow portions therealong;

first and second electrically conductive detector elements spaced apart along said data track means for sandwiching a plurality of wide-narrow portions of said data track means therebetween;

a plurality of separate electrically conductive elements, each substantially centered within successive wide portions of said data track means that are sandwiched between said first and second detector electrodes;

electrically conductive replicator means including an electrically conductive replicator strip-line means aligned along said data track means and coupling replicate drive fields to said data track means across said sandwiched successive wide portions for replicating a cross-tie, Bloch-line pair, if resident at said first detector electrode, in each of the sandwiched successive wide-narrow portions of said data track; and, detector readout means coupling a read current drive signal across said first and second detector elements for generating a readout signal indicative of the presence or absence of said replicated cross-tie, Bloch-line pairs in said sandwiched successive wide-narrow portions of said data track.

4. A detector for a cross-tie wall memory system, comprising:

magnetic data track means;

first and second electrically conductive detector elements spaced apart along said data track means, for sandwiching a plurality of memory cells therealong;

a plurality of separate electrically conductive elements, each substantially centered within successive ones of the memory cells that are sandwiched between said first and second detector electrodes;

electrically conductive replicator means including a replicator drive line means aligned along said data track means coupling a plurality of replicate drive fields to said data track means across said sandwiched successive memory cells for replicating a cross-tie, if resident at said first detector electrode, in each of said sandwiched successive memory cells; and, detector readout means coupling a read current drive signal across said first and second detector elements for generating a readout signal indicative of the presence or absence of said replicated cross-ties, in said sandwiched successive memory cells.

5. The detector of claim 4 wherein said plurality of separate electrically conductive detector elements and said first and second detector elements are spaced apart along said data track means for forcing said read current drive signal to flow through said data track means in the areas of said data track means between said plurality of separate electrically conductive detector elements but to flow out of said data track means and through said plurality of separate electrically conductive detector elements.

6. A detector for a cross-tie wall memory system, comprising:

magnetic data track means having a plurality of memory cells spaced therealong;

first and second electrically conductive detector elements spaced apart along said data track means, for sandwiching a plurality of memory cells therealong;

a plurality of separate electrically conductive elements electrically conductively affixed to said data track means, each substantially centered within successive ones of the memory cells that are sandwiched between said first and second detector elements;

replicator means coupling a plurality of replicate drive fields to said data track means across said sandwiched successive memory cells for replicating a cross-tie, only if resident at said first detector element, in each of said sandwiched successive memory cells; and, detector readout means coupling a read current drive signal across said first and second detector elements for generating a readout signal indicative of the presence or absence of said replicated cross-ties, in said sandwiched successive memory cells.

7. The detector of claim 6 wherein said plurality of separate electrically conductive detector elements and said first and second detector elements are spaced apart along said data track means for forcing said read current drive signal to flow through said data track means in the areas of said data track means between said plurality of separate electrically conductive detector elements but to flow out of said data track means and through said plurality of separate electrically conductive detector elements.

* * * * *